(12) United States Patent
Stojanov

(10) Patent No.: US 6,947,337 B2
(45) Date of Patent: Sep. 20, 2005

(54) RANDOM-ACCESS MEMORY DEVICES COMPRISING A DIODED BUFFER

(75) Inventor: Nikola Stojanov, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/486,059

(22) PCT Filed: Aug. 7, 2002

(86) PCT No.: PCT/IB02/03331

§ 371 (c)(1),
(2), (4) Date: Feb. 6, 2004

(87) PCT Pub. No.: WO03/015101

PCT Pub. Date: Feb. 20, 2003

(65) Prior Publication Data

US 2004/0240287 A1 Dec. 2, 2004

(30) Foreign Application Priority Data

Aug. 8, 2001 (EP) .............................. 01119102

(51) Int. Cl.⁷ ................................. G11C 7/00
(52) U.S. Cl. ............................ 365/189.05; 365/230.08; 365/205; 327/314; 327/320
(58) Field of Search ............... 365/189.05, 230.08, 365/205; 327/314, 320

(56) References Cited

U.S. PATENT DOCUMENTS

| | | | | |
|---|---|---|---|---|
| 4,879,690 A | * | 11/1989 | Anami et al. | ............... 365/201 |
| 5,309,396 A | * | 5/1994 | Kimura | ................. 365/189.05 |
| 6,756,826 B1 | * | 6/2004 | Klein et al. | ................. 327/112 |
| 6,765,549 B1 | * | 7/2004 | Yamazaki et al. | ............ 345/80 |

FOREIGN PATENT DOCUMENTS

| | | |
|---|---|---|
| EP | 0 136 106 | 4/1985 |
| EP | 0 140 768 | 5/1985 |

* cited by examiner

*Primary Examiner*—Anh Phung
*Assistant Examiner*—N Guyen
(74) *Attorney, Agent, or Firm*—Kevin Simons

(57) ABSTRACT

Random-access memory device having select lines, bit lines, and several RAM cells, each RAM cell being connected to a corresponding one of said select lines and to a corresponding one of said bit lines. The random-access memory device further having select buffers for selecting the read-out of one out of the selected lines when receiving a selection signal. Each of the select buffers having an inverter serving as driver. The inverter is being followed by a diode for limiting output voltage swings at the respective select line.

13 Claims, 4 Drawing Sheets

RANDOM-ACCESS MEMORY DEVICES COMPRISING A DIODED BUFFER

Figure 1:
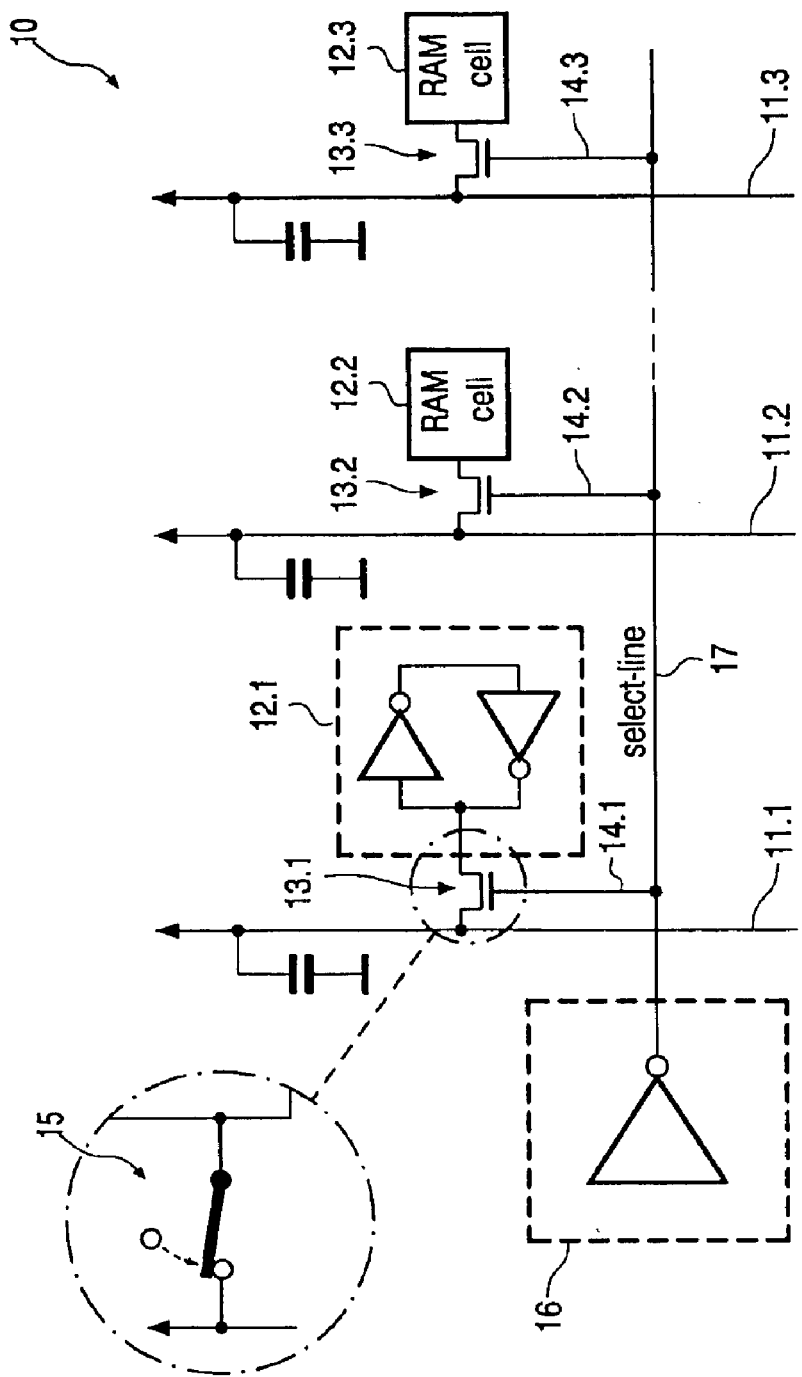

The present invention relates to random-access memory (RAM) devices and, more particularly, to a RAM device incorporating select buffers for read-out.

In general, a RAM device comprises a large number of RAM cells each having some sort of a bistable flip-flop circuit, which uses several transistors per bit to be stored. Usually, a RAM cell comprises a pair of driver transistors which are cross-coupled to each other, a pair of load resistors or load transistors, and a pair of transfer transistors connected to one word line (hereinafter referred to as select line) and to one pair of bit lines. In such a RAM cell, only one of the driver transistors is turned on to correspond to memory data "1" or "0".

In order to read the RAM cell, the transfer transistors are turned on by changing the potential of the select line and the data on the driver transistor is transferred to the bit lines. On the other hand, writing is achieved by also turning on the transfer transistors and then applying the proper voltage to the bit lines.

Conventional RAM devices of a MOS static type incorporate a large number of such memory cells arranged along rows and columns which are orthogonal to each other.

In addition, the RAM device comprise a plurality of select lines each connected to the RAM cells belonging to one corresponding row, a plurality of pairs of bit lines, each pair connected to the RAM cells belonging to one corresponding column, and a plurality of pairs of bit drivers, each pair connected to one corresponding pair of the bit lines. In this case, selection of one cell among the memory cells is effected by selecting one of the select lines and one pair of the bit lines.

In the above-mentioned conventional devices, when one RAM cell is selected so as to read the data stored in the cell, transfer transistors of other non-selected RAM cells belonging to the same select line of the selected RAM cell are also turned on, so that currents flow from a power supply through the non-selected RAM cells to another power supply (ground). Therefore, since a large number of non-selected RAM cells are connected to one select line, the power dissipation is high.

There is a strong interest when designing RAM devices to keep them as compact as possible. An important issue is the splitting, or dividing of the RAM into different blocks. One limiting factor of the RAM-block size is the output bus. This is for example the case for liquid crystal display (LCD) RAM devices, where the read-out port uses a large bus. For a Multiple Row Addressing (MRA) RAM this is a significant issue, since for each column several pixels (rows) have to be read-out at once. E.g., for 128 columns and an MRA mode of 8, one would have to read out 1024 bits at once.

To be more precise, the limitation is actually due to the read-out of the RAM device. Reading out 1024 bits at once by short-circuiting 1024 output bit-lines to ground (worst case where all RAM cells have the value '0') is producing an important discharge current of the bit-line capacitances to ground. This may affect the functionality of the RAM (unstable voltage on the RAM-ground).

Looking at the classical way how data from a RAM device 10 are read out, one notices that the bit lines 11.1–11.3, which were previously pre-charged to a voltage VDD, are short-circuited to ground via the RAM cells 12.1–12.3, as illustrated in FIG. 1. So the discharge of the bit-lines 11.1–11.3 takes place mainly through the select transistor 13.1–13.3 and the NMOS-transistor of the respective RAM cell 12.1–12.3. The select transistor 13.1–13.3, which gets applied VDD to its gate 14.1–14.3, is in strong inversion and saturated, meaning that it is working as an "ideal" switch in short-circuit mode. The RAM device 10 further comprises select buffers for selecting the read-out. In the FIG. 1, only one select buffer 16 and one select line 17 are shown. When the select buffer 16 receives a selection signal, one or more of the RAM cells 12.1–12.3 can be read out.

In the present example, the RAM cell 12.1 is being read out since the select transistor 13.1 is closed. An "ideal" switch 15 representing the select transistor 13.1 is illustrated on the left hand side of FIG. 1. While this switch 15 is closed, the bit being stored in the RAM cell 12.1 is being read out.

There are certain RAM devices generally used in display drivers (DD) that are using only one bit line for the read-out. Renouncing the complementary bit-line (also called inverse bit-line) the RAM device can be reduced in terms of area since only one bit line has to be routed through the RAM instead of two bit lines.

The solution presented in FIG. 1 is actually a proven read-out method used in many RAM devices.

However, the displays are becoming larger and larger. Not only the resolution of displays is increasing but there is also an increasing demand for improved grayscale, respectively color displays. The MRA architecture for RAMs is a way to handle the problems that arise for the physical requirements for the display drivers. So advantageous MRA is for physical limits, so challenging it is for the RAM design. Since multiple select lines are addressed at once for the read-out, more than one bit per column has to be routed to the output of the RAM device.

If 8rows are addressed at once (referred to as MRA-8) this means, that 8times more bits have to be read-out at once as compared to a normal addressing method (row-by-row).

It is an object of the present invention to provide random access memory devices and displays with improved functionality.

It is an object of the present invention to provide random access memory devices and displays where the peak discharge current of the bit-line capacitances to ground is reduced.

A solution is herein described and claimed that enhances the design of a conventional RAM device by reducing the peak-current that results from a read-out of the RAM.

A random-access memory device, according to the present invention, comprises select lines, bit lines, and RAM cells. Each RAM cell is connected to a corresponding one of the select lines and to a corresponding one of the bit lines. In addition, the random-access memory device comprises select buffers of the select lines for the read-out enabled when receiving a selection signal. The select buffers comprise an inverter serving as driver. The inverter is followed by a diode for limiting output voltage swings at the respective select line.

According to the present invention, the following steps are executed:
  applying a selection signal to one of the select buffers,
  providing for a current flow through the one select buffers being selected by the selection signal, the current flowing towards the select line that is controlled by the one select buffer,
  then providing for the current flow being branched so that part of the current still flows towards the select line that is controlled by the one select buffer, while the remaining part of the current now flows through the diode towards ground, for limiting output voltage swings at the respective select line.

Embodiments in accordance with the present invention are well suited for RAM devices where massive read-outs occur, and in particular where current sense amplifiers are employed for the read-out.

Figure 2:
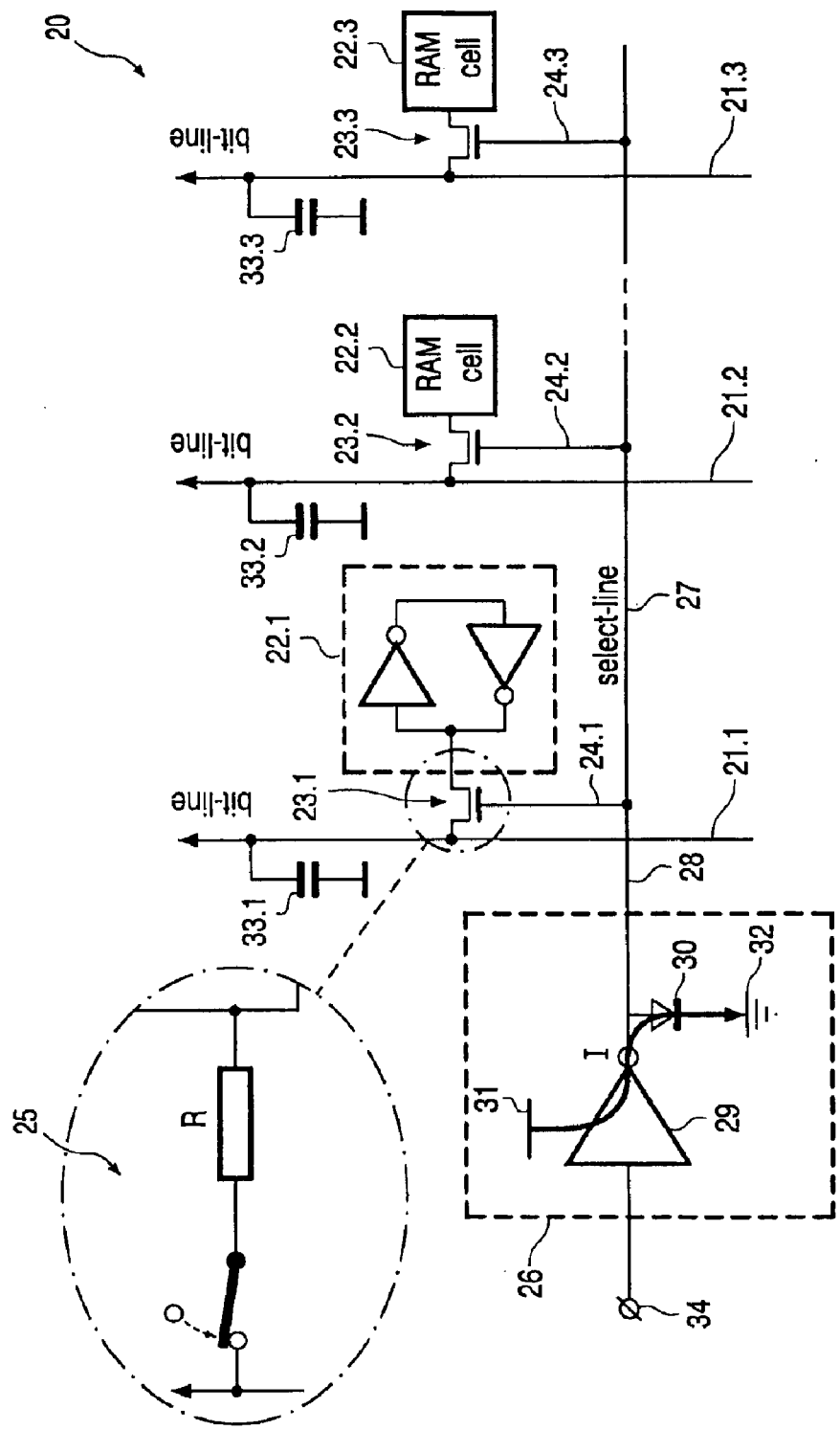
Figure 3A:
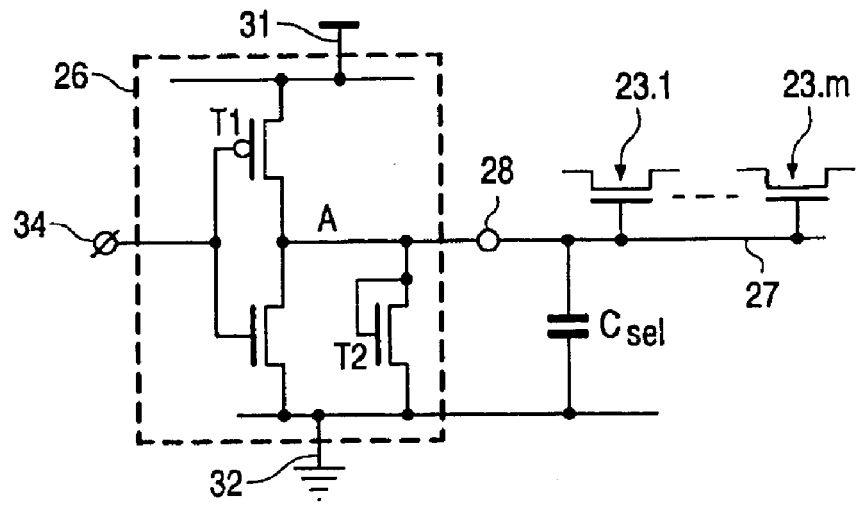
Figure 3B:
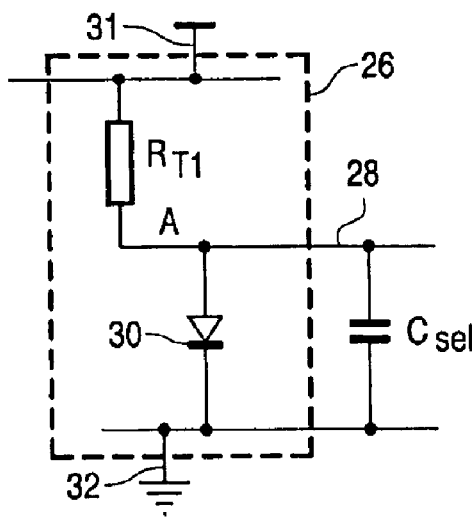
Figure 4A:
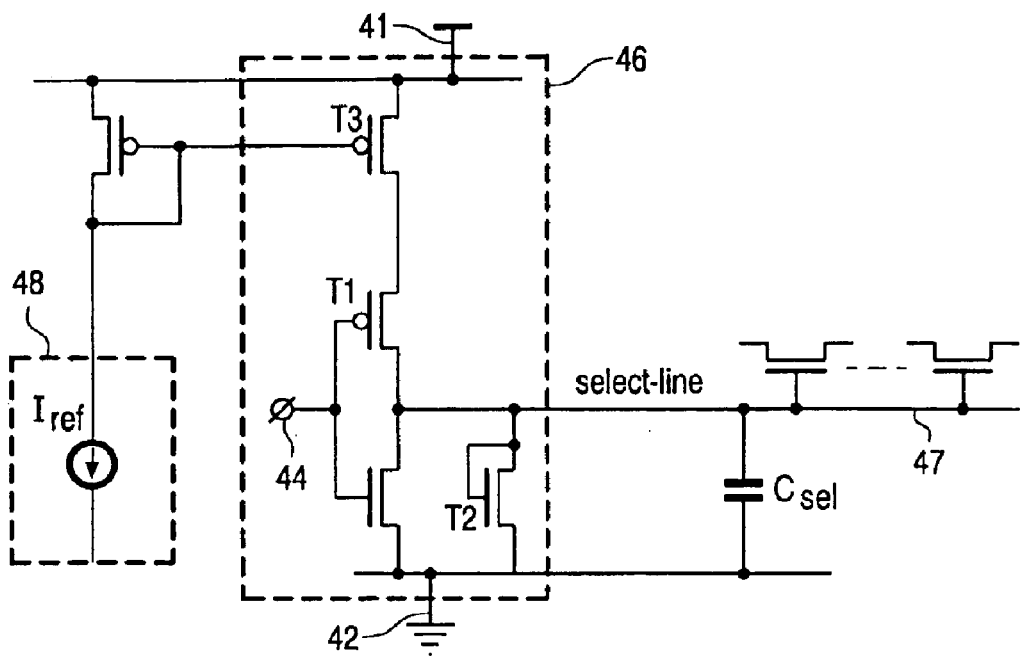
Figure 4B:
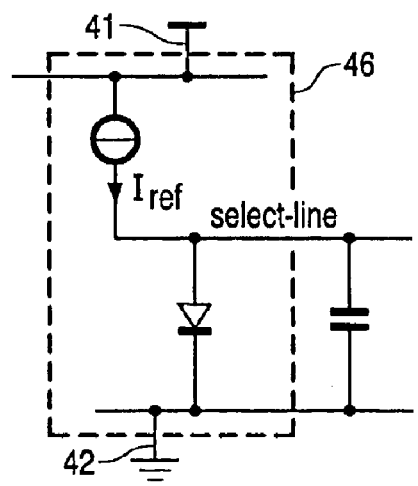

For a more complete description of the present invention and for further objects and advantages thereof, reference is made to the following description, taken in conjunction with the accompanying drawings, in which:

FIG. 1 is schematic block diagram of a conventional RAM device,

FIG. 2 is schematic block diagram of a RAM device according to the present invention, FIG. 3A is schematic block diagram of a dioded buffer, in accordance with the present invention, FIG. 3B is schematic electric equivalent of the dioded buffer of FIG. 3A during the selection phase, FIG. 4A is schematic block diagram of another dioded buffer, in accordance with the present invention, FIG. 4B is schematic electric equivalent of the dioded buffer of FIG. 4A during the selection phase, The solutions proposed herein are providing for a reduced peak-current resulting from the bit-line discharge during the read-out. In order to achieve this, the gate voltage of the select transistors in the RAM cells is not driven with VDD, but with a voltage that ensures the working mode of the select transistor in weak inversion.

This has the effect that the select transistor is not working as an "ideal" switch, but as a high-ohmic switch.

The underlying principle is illustrated in FIG. 2. A RAM device 20 is shown. It comprises n select lines 27 (only one select line is shown in FIG. 2), m bit lines 21.1–21.3, and nxm RAM cells 22.1–22.3. Each RAM cell 22.1–22.3 is connected to a corresponding one of said n select lines 27 and to a corresponding one of said m bit lines 21.1–21.3. In the present example, the RAM cell 22.1 is connected between the select line 27 and the bit line 21.1, the RAM cell 22.2 is connected between the select line 27 and the bit line 21.2, and the RAM cell 22.3 is connected between the select line 27 and the bit line 21.3.

Select buffers are provided for selecting RAM cells through the select line 27 for the read-out of data. In the present example, just one select buffer 26 is shown. When receiving a selection signal, this select buffer 26 ensures that a certain voltage Vx is provided at the select buffer output 28 and thus at the select line 27. According to the present invention, this voltage Vx is smaller than the supply voltage VDD and larger than the threshold voltage Vthresh of the select transistors 23.1–23.3. That is: Vthresh<Vx<VDD.

According to one embodiment of the present invention, the supply voltage VDD is between 1.5 V and 3.3 V and the voltage Vx is between 0.5 V and 1 V, and preferably between 0.7 V and 0.9 V.

As illustrated in FIG. 2, the select buffer 26 comprises an inverter 29 serving as driver. The inverter 29 being followed by a diode 30 for limiting output voltage swings at the select buffer output 28 and thus also at the respective select line 27. The select buffer 26 according to the present invention is herein referred to as a dioded buffer.

Due to the usage of a dioded buffer (e.g., the buffer 26), a current I is flowing from the terminal 31, that is at a potential VDD, to the terminal 32 that is connected to ground (GND). This current flow I, unlike the bit-line current in conventional RAM devices, is not a discharge current, meaning that this current I increases the power consumption of the overall RAM device.

Note, the relative current increase of the dioded buffer 26 with respect to the whole current consumption becomes more important for low VDD than for high VDD voltages. When using a standard select buffer 16, the buffer 16 has to charge the whole select line 17 to the voltage VDD. The select buffer 16 is also tearing current from the voltage source provided the VDD supply voltage. Whereas when using a dioded buffer 26, according to the present invention, the select line 27 will only be charged to a voltage Vx slightly above the threshold voltage Vthres. The voltage Vthres is typically smaller than 1 V.

Due to the reduced voltage at the select buffer output 28, the current needed to charge the select line 27 is reduced. On the other hand the dioded buffer 26 needs some current during the enabling period.

From the viewpoint of one of the bit lines 21.1–21.3, the RAM cells 22.1–22.3 are acting more like current sources which tear currents from the bit lines 21.1–21.3 and not like voltage sources in conventional RAM devices, where the select transistors 23.1–23.3 are driven with a VDD supply voltage at the gates 24.1–24.3.

Due to the fact that the voltage Vx is larger than the threshold voltage Vthres and smaller than the supply voltage VDD, the select transistors 23.1–23.3 are operated as high-ohmic switches. That is, according to the present invention, the select transistors 23.1–23.3 are intentionally operated at a voltage Vx that ensures a working mode in the weak inversion regime. In FIG. 2, one of the select transistors, namely the transistor 23.1, is shown as a high-ohmic switch 25. In FIG. 2, the high-ohmic switch 25 is represented by an ideal switch followed by a resistor R.

A reduction of the peak discharge current is achieved by means of the high-ohmic select transistors 23.1–23.3 due to the increased time constant R×C resulting from the bit line capacitance 33.1–33.3 and switch resistors R. As a side effect, the dioded buffer 26, which is driving the select transistors 23.1–23.3, is tearing a current from the VDD supply source to GND.

A more detailed description of the dioded buffer 26 in accordance with the present invention is given in connection with FIGS. 3A and 3B. When a select line 27 of a RAM device 20 is selected, the dioded buffer 26 receives a selection signal at its input terminal 34. In the present example, a 'zero' signal serves as selection signal for the select line 27 controlled by the dioded buffer 26. When the selection signal is switched to 'zero', the PMOS transistor T1 of the dioded buffer 26 is switched on and starts to charge the capacitance of the select line 27. In FIG. 3A, this select line capacitance is schematically represented by a capacitor Csel (herein called first phase). Since the select line 27 initially has a 'zero' as well, the transistor T2 serving as diode is not conducting. In this case, the whole current flowing through the PMOS transistor T1 is aimed to charge the select line capacitance Csel, as for conventional select line buffers. When the select line approaches a voltage that enables conductance of the transistor T2 branched as diode (typically around Vthresh), the current flowing through the PMOS transistor T1 is deviated to pass through the diode (transistor T2) and not only to charge the select line capacitance Csel (herein called second phase). So the voltage at the output terminal 28 is such that the NMOS transistor T2 is conducting as well as all the other select transistors 23.1–23.m connected to this particular select line 27.

As the voltage at the output terminal 28 does not rise to VDD but stays at the minimal pinch-off voltage Vx (slightly above Vthresh) the other select transistors 23.1–23.m are conducting as well, but they stay in weak, respectively moderate inversion which lets behave them as high ohmic resistors.

The electrical equivalent of this circuit 26 during the selection phase is illustrated at FIG. 3B. Note that the resistance RT1 of the PMOS transistor T1 mainly determines the current flowing during the selection phase. Hence, the PMOS transistor T1 is preferably a transistor with a small W/L (large resistance).

Another embodiment of a dioded buffer 46, according to the present invention is illustrated in FIGS. 4A and 4B. These Figs. show an improved solution for the dioded buffer 46. The disadvantage of the diode's current consumption during the selection phase can be limited by employing a current source.

When a current source is already available on the chip on which the RAM device is realized, the reference current provided by this current source can be used to limit the current passing through the dioded buffer 46 during the selection phase. The implementation of a current source only for the dioded buffer may not be justifiable, since the current source will consume permanent current and thus increasing the power consumption of the whole RAM device.

Disposing of a current source on the chip on which the RAM device is realized, this current can be mirrored to the dioded buffer 46. The electrical schematic of this solution is shown in FIG. 4A. FIG. 4B shows an electrical equivalent circuit of the enhanced dioded buffer 46 during the selection phase. When the dioded buffer 46 is not enabled, i.e., while a selection signal '1' is applied to its input terminal 44, the current mirror 48 over the dioded buffer 46 is switched off.

As soon as the dioded buffer 46 is enabled by applying a selection signal '0' at its input 44, the dioded buffer 46 switches on the current mirror 48 and the whole circuit will work as described before in connection with FIGS. 3A and 3B, with the difference that the current charging the select line capacitance Csel in the first phase and flowing through the diode in the second phase will be controlled by the current mirror 48. Hence, if one has a reference current which is not dependant on the supply voltage VDD at terminal 41, the peak-current flowing through the dioded buffer 46 will not depend on the supply voltage VDD either.

However, the current from the current mirror 48 should be high enough to ensure a charge of the select line capacitance Csel that is fast enough, meaning that the select time of the RAM cells for read-out is to be kept small enough to fulfill the specification of the RAM device.

The present invention allows reducing the peak discharge current for massive read-out in RAM devices. The invention provides for a distribution of the discharge over a larger period of time.

The present invention allows realizing larger RAM blocks without having to split the RAM.

The dioded buffer described and claimed herein are independent on the process and/or technology used. The architecture of the dioded buffers is relatively simple.

The high-ohmic resistance is desirable for current sense amplifiers. In other words, the present invention is well suited for use in current sense amplifiers. A current sense amplifier is expecting the RAM device to be acting as current source. This is only possible with high-ohmic switches, according to the present invention.

The present invention allows the same RAM devices to be used for a wide range of power supplies.

The embodiments and implementations presented are a compromise between current consumption and scalability in supply voltages.

The dioded buffer approach described and claimed herein represents a viable solution for high-voltage (VDD>3V) RAM application as well as for low-voltage (VDD<1.8V) RAM applications.

The present invention is well suited for high-resolution display configurations.

It is appreciated that various features of the invention which are, for clarity, described in the context of separate embodiments may also be provided in combination in a single embodiment. Conversely, various features of the invention which, for brevity, are described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

What is claimed is:

1. Random-access memory device comprising n select lines, m bit lines, n×m RAM cells, each RAM cell being connected to a corresponding one of said n select lines and to a corresponding one of said m bit lines, and k select buffers for selecting the read-out of one out of the n select lines when receiving a selection signal, where k smaller or equal than n, wherein
   each of said select buffers comprises an inverter serving as driver, the inverter being followed by a diode for limiting output voltage swings at the respective select line
   whereby the select buffers provide a certain voltage to the select lines that is smaller than a supply voltage of the device.

2. The Random-access memory device of claim 1, whereby each RAM cell comprises a select transistor situated between one of said m bit lines and one of said n select lines.

3. The Random-access memory device of claim 2, whereby the select transistors are driven with a voltage that ensures a working mode of the select transistors in weak, inversion.

4. The Random-access memory device of claim 2, whereby the select transistors are driven with a voltage so as to operate them as high-ohmic switches.

5. The Random-access memory device of claim 2, whereby the select buffers ensure that a certain voltage is provided at the respective select line, this certain voltage being smaller than the random-access memory device's supply voltage and larger than a threshold voltage of the select transistors.

6. The Random-access memory device of claim 5, whereby the supply voltage is between 1.5 V and 3.3 V and the certain voltage is between 0.5 V and 1 V, and preferably between 0.7 V and 0.9 V.

7. The Random-access memory device of claim 1, whereby the select buffers are provided for selecting several of the n×m RAM cells through the select line to which the respective select buffer is connected for the read out of data.

8. The Randomaccess memory device of claim 1, whereby a transistor branched as diode serves as the diode for limiting output voltage swings.

9. Display, comprising a random-access memory device according to claim 1.

10. The Random-access memory device of claim 1, wherein the diode comprises an n-channel field effect transistor coupled drain-to-source between the output node of the inverter and ground, the gate of the transistor being coupled to the drain of the transistor.

11. The Random-access memory device of claim 10, further comprising a current mirror coupled to the inverter.

12. The Random-access memory device of claim 11, wherein the current mirror is coupled to a reference current that is not dependent on the supply voltage of the RAM cells.

13. Method for reading data from a random-access memory device having:
   select lines,
   bit lines,
   RAM cells, each RAM cell being connected to a corresponding one of said select lines and to a corresponding one of said bit lines, and
   select buffers for selecting the read-out of one out of the select lines when receiving a selection signal, whereby each or the select buffers comprises an inverter serving as driver, and a diode the method comprising the steps:
   applying a selection signal to one of the select buffers,
   during a first phase, providing for a current flow through the one select buffer being selected by the selection signal, the current flowing towards the select line that is controlled by the one select buffer,
   during a second phase, providing for a current flow being branched so that part of current still flows towards the select line that is controlled by the one select buffer, while the remaining part of the current flows through the diode towards ground, for limiting output voltage swings at the respective select line; and
   supplying a certain voltage to the select lines that is smaller than a supply voltage of the device.

* * * * *